United States Patent [19]

Cote et al.

[11] Patent Number: 5,308,438

[45] Date of Patent: May 3, 1994

[54] ENDPOINT DETECTION APPARATUS AND METHOD FOR CHEMICAL/MECHANICAL POLISHING

[75] Inventors: William J. Cote, Poughquag, N.Y.; John E. Cronin, Milton, Vt.; William R. Hill, Underhill, Vt.; Cheryl A. Hoffman, Colchester, Vt.

[73] Assignee: International Business Machines Corporation, Armonk, N.Y.

[21] Appl. No.: 828,054

[22] Filed: Jan. 30, 1992

[51] Int. Cl.$^5$ .................................. H01L 21/304
[52] U.S. Cl. ............................. 156/636; 156/627; 437/228; 151/281 R; 151/283 R; 151/307
[58] Field of Search ............... 437/228; 156/636, 627; 51/307, 281 R, 283 R

[56] References Cited

U.S. PATENT DOCUMENTS

| | | | |
|---|---|---|---|
| 3,874,959 | 4/1975 | Hoekstra et al. | 156/345 |
| 4,193,226 | 3/1980 | Gill, Jr. et al. | |
| 4,207,137 | 6/1980 | Tretola | 156/646 |
| 4,602,981 | 7/1986 | Chen | 156/646 |
| 4,793,895 | 12/1988 | Kaanta et al. | 156/636 |
| 4,910,155 | 3/1990 | Cote et al. | 156/636 |
| 4,992,135 | 2/1991 | Doan et al. | 156/636 |
| 5,036,015 | 7/1991 | Sandhu et al. | 437/8 |
| 5,081,421 | 1/1992 | Miller et al. | 156/627 |
| 5,084,071 | 1/1992 | Nenadic et al. | 51/309 |
| 5,132,617 | 7/1992 | Leach et al. | 156/627 |

OTHER PUBLICATIONS

"End Point Detector for Chemi–Mechanical Polisher", *IBM Technical Disclosure Bulletin,* vol. 31, No. 4, Sep. 1988, pp. 325–326.

"Analyzing the Components of Chemo–Mechanical Polishing", *Surfacetech Review,* vol. 1, issue 5, Oct. 1988 pp. 1–4.

S. Wolf, *Silicon Processing for the VLSI Era,* vol. 2, Lattice Press, Sunset Beach, 1990, pp. 247–251.

"Spinning Etchant Polishes Flat, Fast," Electronics, vol. 55, No. 1, Jan. 13, 1982, pp. 40–1.

*Primary Examiner*—Brian E. Hearn
*Assistant Examiner*—Laura M. Holtzman
*Attorney, Agent, or Firm*—William D. Sabo

[57] ABSTRACT

An apparatus and method for determining a selected endpoint in the polishing of layers on a workpiece in a chemical/mechanical polishing apparatus where the workpiece is rotated by a motor against a polishing pad. When a difficult to polish layer, i.e., one requiring a chemical change in a surface skin of the layer which skin is then abraded away by a mechanical process is removed from a more easy to polish surface, i.e., one that relies solely on mechanical abrasion and does not need to have a chemically converted skin thereon. The power required to maintain a set rotational speed in a motor rotating the workpiece significantly drops when the difficult to polish layer is removed. This current drop is used to detect the point at which the polishing must be stopped to avoid over polishing effects, i.e., dishing or thinning or removal of the more easily removed underlying material. Thus, an end point in the process can be established.

14 Claims, 2 Drawing Sheets

ENDPOINT DETECTION APPARATUS AND METHOD FOR CHEMICAL/MECHANICAL POLISHING

FIELD OF THE INVENTION

This invention relates to an apparatus and method for determining an endpoint in a chemical/mechanical process for polishing the surface of a semiconductor wafer.

BACKGROUND OF THE INVENTION

In wiring integrated circuits, selected metal deposits are placed on substrates containing devices. These metal deposits serve to electrically connect discrete devices formed in the substrate and may be created, for example, by chemical vapor deposition processes or other such techniques that are well known to the semiconductor art. These deposits may also be in the form of lines deposited over and through insulating layers and have other insulating layers formed over them. In most cases, these result in an uneven surface which must then be planarized by removal of some of the over lying materials. In other cases the deposits must be configured by a partial removal of the deposited material. Such removal is usually done by the use of chemical/mechanical processes using lapping or polishing machines. In these machines, selected amounts of material must be removed to provide a desired surface without removing excess amounts of desired underlying materials, thus precise endpoint detection techniques are required.

Presently, there are various types of machines for polishing, removing or reducing layers on the surface of semiconductor wafers. In general such machines include top and bottom plates between which the wafers to be treated are positioned. The two plates are moved relative to each other and a slurry consisting of an abrasive solution, with or without an etching reagent, is fed between the plates to grind and flush away the wafer particles. Such machines are well known to the art and are commercially available.

In such machines, various devices and methods have been used for determining endpoints in the processing of such semiconductor wafers. U.S. Pat. No. 3,874,959, discloses an apparatus for detecting the etch endpoint of an oxide coated semiconductor substrate using electrodes coupled to the semiconductor wafer and to the solution used to etch the oxide so that as the oxide is etched away a signal is detected by virtue of the etching solution making electrical contact with the underlying substrate material.

U.S. Pat. No. 4,207,137 discloses a plasma endpoint etching process wherein the impedance of the plasma varies during the etching process which variation can be measured and the endpoint determined thereby.

U.S. Pat. No. 4,602,981, also determines endpoint in a plasma etching process by measuring the RF voltage of an electrode in a plasma etching process.

IBM Technical Disclosure Bulletin, Vol. 31, No. 4, September 1988, on pages 325 and 326, describes an endpoint detector for a chemical/mechanical polisher wherein the current to the motor driving the table is monitored to determine when a particular layer has been removed and the material underneath it is being polished.

Another method to determine endpoint in polishing machines is described in U.S. Pat. No. 4,910,155 wherein a monitor wafer is coated with the desired oxide thickness and the current of the motor driving the wafers is continuously measured until the oxide on the dummy wafer is totally removed causing a current spike in the motor driving the dummy wafer. The detected current spike is an active indication as to when the oxide material has been removed from the monitor wafer and the process may be then terminated. Other wafers being simultaneously lapped and having an initial oxide thickness greater than the oxide thickness of the dummy wafer will be left with an oxide thickness which is the difference between their original thickness and the thickness removed from the monitor wafer.

This method relies upon a massive frictional drag being realized, by an abrupt change from a soft, easily polished material, such as, oxide to a hard, difficult to polish material, such as silicon.

There remains a continuing need in the semiconductor fabrication art for improved apparatus and methods for accurately and efficiently detecting the endpoint of a lapping, planarization process wherein there is an abrupt change from a difficult to polish material to a more easily polished material.

SUMMARY OF THE INVENTION

It is thus an object of the present invention to provide an apparatus and method which accurately and efficiently detects the endpoint of a planarization process wherein there is an abrupt change from a difficult to polish material requiring both a chemical/mechanical process to a more easy to polish material relying solely on mechanical abrasion.

This and other objects are realized in the present invention which provides an apparatus and method for determining a selected endpoint in the polishing of layers on a workpiece in a chemical/mechanical polishing apparatus where the workpiece is rotated against a polishing pad. When a difficult to polish layer, i.e., one requiring a chemical change in a surface skin of the layer which skin is then abraded away by the mechanical process is removed from a more easy to polish surface, i.e., one that relies solely on mechanically converted skin thereon. The power required to maintain a set rotational speed in a motor rotating the workpiece significantly drops when the difficult to polish layer is removed. This current drop is used to detect the point at which the polishing must be stopped to avoid over polishing effects, i.e., dishing or thinning or removal of the more easily removed underlying material. Thus, an end point in the process can be established.

THE PREFERRED EMBODIMENT OF THE INVENTION

Figure 1:
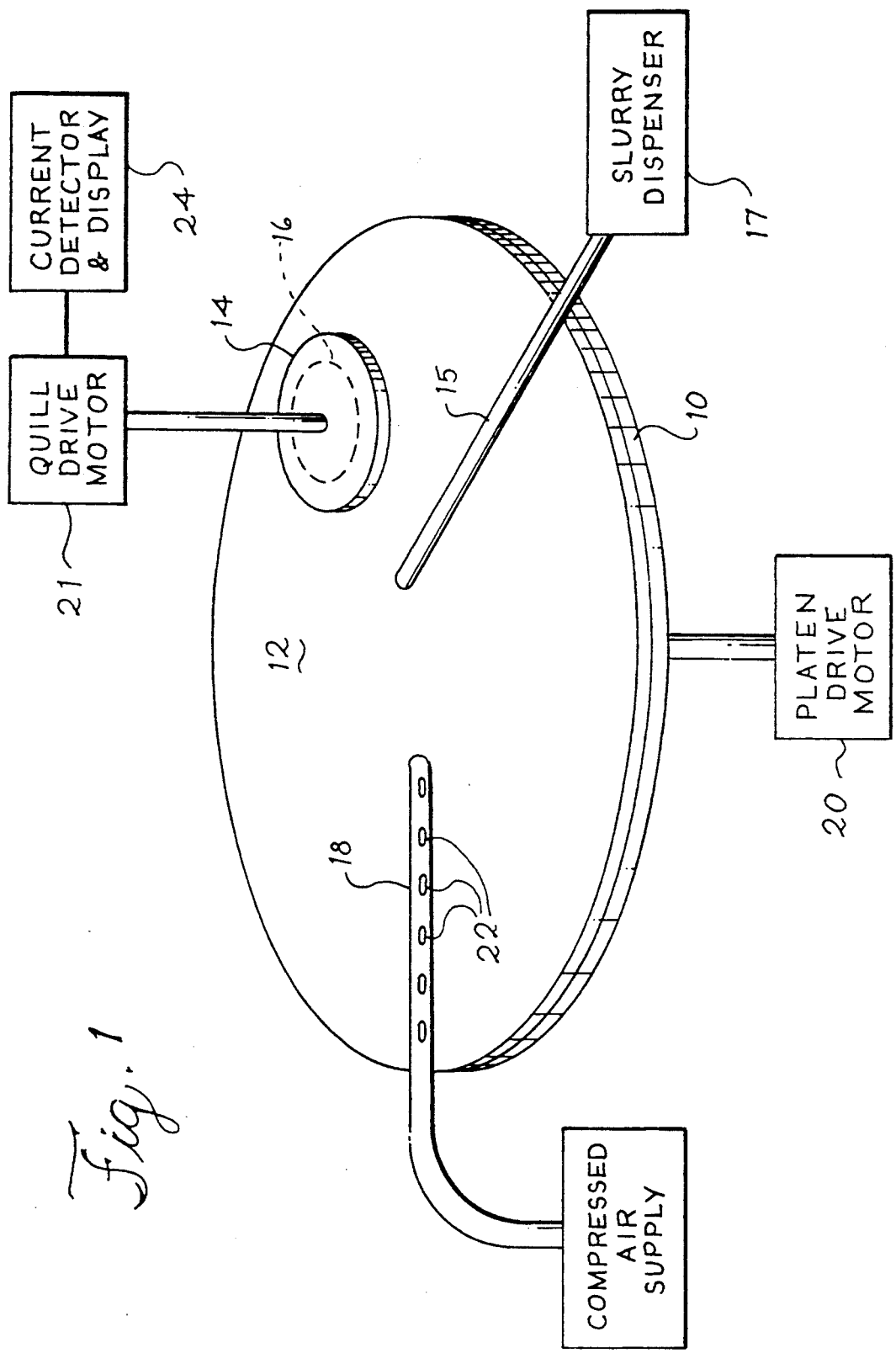
FIG. 1 is a simplified view of a lapping machine according to an embodiment of the invention.
Figure 2:
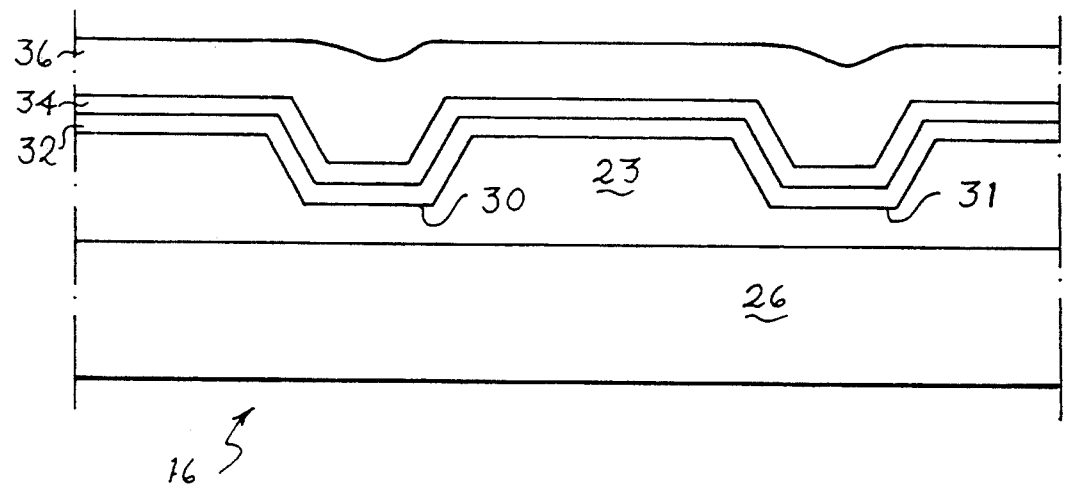
FIG. 2 is a cross-section of the chip being polished in the preferred apparatus.

FIG. 1 shows in schematic form an apparatus for chem/mech polishing of a semiconductor wafer coated with a plurality of layers some of which are to be either partially or completely removed from the surface. A cross-sectional view of the wafer and its surface layers is shown in FIG. 2.

Referring now simultaneously to both FIGS. 1 and 2, the embodiment of the invention will be described. The apparatus of FIG. 1 has a rotatable circular polishing platen 10 having a circular polishing pad 12 mounted thereon. Suspended over the pad 12 is a rotatable polishing head or carrier 14 adapted for holding and rotating a wafer 16 (shown in phantom) against the polishing platen 10. There are a number of manufacturers of such apparatus and these polishing tools are readily commercially available.

Preferably, the platen 10 is driven counter clockwise by a motor 20 and the quill or polishing head 14 is also driven counter clockwise driven by a smaller, separate motor 21. Current detection or sensing equipment 24 is coupled to the motor 21 which drives the polish head 14. In the particular embodiment to be described herein, it has been found that by monitoring current drawn by the drive motor 23 removal of a material from an area of a surface can be detected.

For instance, removal of a difficult to polish layer such as tungsten from an underlying more easily polished layer such as titanium nitride results in a large drop in the current required by the wafer carrier motor 21.

In chem/mech polishing current drawn by the quill motor which rotates the carrier 14 and hence the wafer against the pad or polishing wheel begins to drop when the more difficult to polish material is substantially removed from over the more easily polished underlying material. This current drop is used to detect the point at which polishing must be stopped to avoid any over polishing effects.

The amount of change in current at this point may be maximized by the use of relatively hard polishing pads, high rotational speed, low pressure between the wafer and polishing pad, and other such techniques as will be further described herein.

The wafer 16 to be polished, shown in FIG. 2, is comprised of a silicon body 26 coated with a layer of silicon dioxide 28 which is provided with a number of recesses 30 and 31 therein. Over the oxide 23 is there deposited a layer of barrier layer. Preferably, this barrier layer is formed of a layer of titanium overcoated with a layer of titanium nitride. These layers may be separately deposited or a layer of titanium is first laid down, which when exposed to a nitrogen atmosphere will form thereon a layer of titanium nitride on its surface. The initial layer of titanium so deposited is selected such that after nitriding there is left a layer of pure titanium 32, approximately 800 Angstroms in thickness, overcoated with a layer 34 of a titanium nitride approximately 400 Angstroms thick. Over this layer of titanium nitride is deposited a difficult to polish metallic layer 36 as might be formed of tungsten.

Prior to the placing of the wafer 16 on the pad 12, the pad 12 is saturated with a room temperature slurry formed of an oxidizing agent, such as iron nitrate (Fe(No$_3$)$_3$), dispersed in a water, and aluminum oxide (AL$_2$O$_3$) particles suspended therein. The aluminum oxide particles provides the mechanical abrasive material while the iron nitrate acts as an oxidizing agent and provides the chemical part of the process. This slurry is disposed on the pad 12 through an elongated tube 15 positioned clockwise of the head 14. The slurry to be dispensed is contained in a dispenser 17. Also disposed over the pad 12 and beyond the tube 16, in a clockwise direction, there is disposed an adjacent elongated pipe 18 provided with a plurality of holes 22 along its length coupled via a flexible tube to an air supply 19.

The pad 12 is generally composed of a number of elongated fibers extending substantially perpendicular to the upper surface of the pad for contacting and polishing the wafer of the semiconductor material and is backed with an impervious material, such as, polyethylene terephthalate, i.e., mylar, the slurry being applied to the pad from tube 15 as well as the material polished from the wafer during the polishing remains trapped by the pad fibers. Also, the fibers become compressed or matted by the polishing action. That is, they tend to become flattened during the polishing process and the by-products of the spin polishing materials tend to become imbedded in the fibers except for those that are thrown off from the pad by centrifugal force. It is necessary to remove these products and recondition the pad. This is done by blowing air out the holes 22 in tube 18. This plurality of holes 22 are directed at the surface of the pad to cause the compressed air from source 19 to be directed against the fibers on the polishing pad at an angle of approximately 45° and in the direction of rotation of the platen. This air causes the polishing by-products to be blown away from the pad and to simultaneously raise, i.e., reduce the matting of the flattened fibers thus reconditioning the pad.

The wafer 16 is then placed in the polishing apparatus of FIG. 1 with the tungsten layer 36 face down against the polishing pad 12. The platen motor 20 has its speed set at approximately 35 rpm while the quill motor 21 is set to rotate the wafer carrier at a speed of 75 rpm. It should be noted that the wafer carrier speed can be higher or lower than this designated speed of 75 rpm, but must in any event be in excess of the table speed of 35 rpm. In the preferred embodiment, the wafer carrier 14 is set to apply a pressure of 5 psi between the wafer and the polishing pad. As the pad continues to rotate toward the direction of the wafer 11, the raised fibers are again saturated with the slurry from tube 15.

Figure 3:
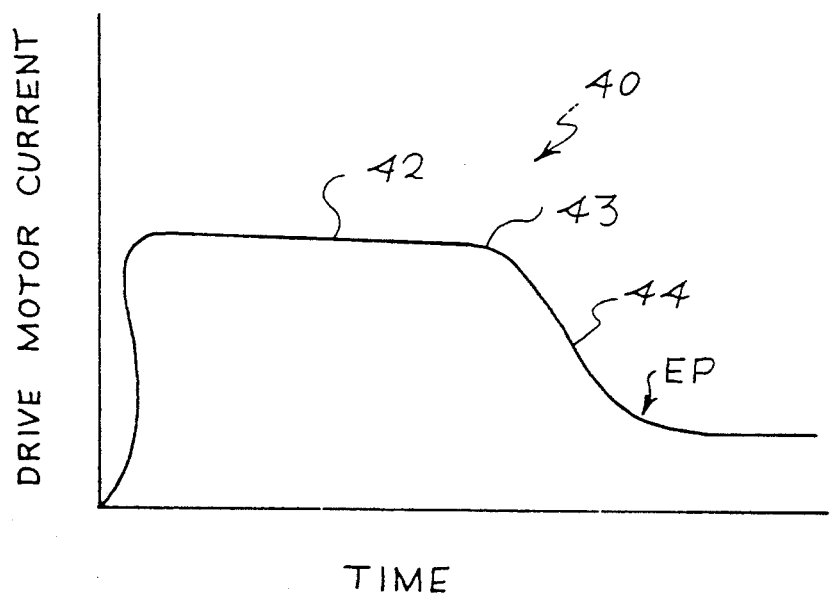
FIG. 3 shows a normalized curve of motor current versus time with the desired endpoint indicated.

FIG. 3 is a normalized curve 40 of the process as it is presently performed using the above described chemicals and processes. It has been found that as the tungsten layer 36 first begins to be polished the current drawn by the motor rapidly rises and remains substantially constant over a fixed period of time as shown by the flat portion 42 of the curve 40. Because of uneven thicknesses in the tungsten layer, as well as, nonuniformity on the chemical/mechanical process, some regions of the tungsten layer may be polished away faster than other regions exposed to the polishing pad to expose the underlying layer of titanium nitride in a nonuniform way. The drag caused by the tungsten layer becomes correspondingly reduces as its total area exposed to the polishing process becomes reduced causing the motor 21 to need less current and the curve begins to decay from the substantially flat portion 42 as indicated by point 43. The current drawn by the motor begins to drop slightly at this point 43 because the frictional forces induced by the tungsten layer is reduced and the more easily polished underlying titanium nitride layer 34 requires less power to be polished. A titanium nitride provides less resistance to the polishing head thus reducing the frictional drag between the pad and the wafer. When the tungsten has been removed from the wafer, except for the portions left in the pockets 30 and 31 the current drawn by the quill motor 21 again reaches a substantially steady state condition and the curve again flattens out. At point EP, wherein the tungsten layer 36 has been removed except for the small regions remaining in the recesses 30 and 31, the curve again flattens indicating that the desired endpoint of the process has been reached, that is all the tungsten except for those amounts in the recesses 30 and 31 has been removed from the surface. The wafer is now removed from the apparatus.

It has been found that by varying the pressure between the wafer and the pad, the curve 40 can be extended in time. A lesser pressure takes a longer period of the tungsten to be removed and thus extends point 43 further to the right. A higher pressure will cause the point 43 to move tot the left and the slope of the curve between points 43 and EP becomes steeper. The inventors have found for the wafer described in FIG. 2 that a pressure of approximately 5 psi is preferred when the above platen and quill speeds are used. However, this pressure can be varied. It has also been found out that if the air brush conditioner described above is not utilized it is more difficult to detect the endpoint EP as the number of wafers polished increase. It is recommended that the process be continued for one minute after the titanium nitride has been reached in order to remove the titanium nitride and to expose the surface of the titanium layer 32. This exposed titanium surface is then treated by further processing steps in the production of semiconductor devices.

Using the above described process, it has been found that a tungsten layer, having the thickness of 1.4 microns, will be removed as described above in not less than 5 minutes and in not more than 5.6 minutes. When the thickness of the tungsten is 1.3 microns, the polishing time varies between 5.2 and 5.4 minutes. When the tungsten thickness is 1.2 microns it has been found that the polishing time is between 4.8 and 5 minutes. Thus, by detecting the current being supplied to the quill motor an easy means of detecting the etching point at which a difficult to remove layer has been removed and a more easy to remove underlayer has been reached. Thus, there has been described an invention that provides for the establishment of a polishing endpoint by monitoring the current drawn by a motor in the polishing apparatus. A reduction in current drawn by the motor can be used to indicate the removal of a high frictional producing material from the surface of a more easily polished material.

It should be readily obvious to one skilled in the art that structural modifications can be made to the detection system of the invention along with changes in the speeds of the table and the platen and changes in applied pad pressure. Moreover, the advantages of the invention are not limited to the particular embodiment described above and that other particular features commensurate with the invention can be used. Accordingly, the invention should be limited only by the following claims.

Wherein we claim:

1. In a process of polishing of a layer of a first material requiring a chemical/mechanical removal process arranged over a layer of second material requiring only a mechanical removal process disposed on a surface of a workpiece wherein the workpiece is rotated by a first motor and is brought into contact with a polish wheel rotated by a second motor and having a polishing pad disposed thereon, the improvement comprising:
   providing a chemical/mechanical slurry on said polishing pad wherein said polishing pad is coated with said slurry;
   placing the workpiece on the polishing pad and rotating the workpiece and the polishing pad,
   maintaining the rotational speed of the workpiece above the rotational speed of the polish wheel and applying pressure to the workpiece and;
   monitoring the current drawn by the first motor.

2. The processes recited in claim 1, wherein the temperature of the slurry is maintained between 60° and 85° F.

3. The processes recited in claim 1, wherein the slurry comprises water containing an oxidizing agent and an abrasive.

4. The processes recited in claim 3, wherein the abrasive agent is comprised of aluminum trioxide.

5. The processes recited in claim 3, wherein the oxidizing is metal salt.

6. The processes recited in claim 3, wherein iron nitrate serves as the oxidizing agent.

7. The process of claim 1 wherein said pad is comprised of an underlayer impervious at least to the slurry, and covered with a plurality of fibers.

8. The process of claim 7 wherein there is disposed over the polishing pad an air brush conditioner for conditioning the polishing pad before it encounters the workpiece by blowing off used slurry.

9. The process of claim 1 wherein said first material is tungsten and said second underlying material is titanium nitride.

10. The process of claim 1 further comprising stopping the polishing after the current drawn by the motor being monitored is reduced.

11. The process of claim 1 wherein there is further provided the steps of:
    treating a surface of the workpiece by,
    depositing a layer of a first material having a first coefficient of friction on said surface of said workpiece;
    depositing on said first material a layer of a second material having a second coefficient of friction wherein said second coefficient of friction is higher that said first coefficient;
    holding said workpiece with said materials in contact with said polishing pad disposed on said polish wheel;
    providing a slurry on said polishing pad;
    monitoring said current in said first motor for a reduction in current; and
    stopping said polishing after said reduction in current is detected.

12. The process as recited in claim 11 further comprising,
    depositing a third material having a third coefficient of friction after depositing said first material and before depositing said second material, wherein said second coefficient is higher than said third coefficient.

13. The process as recited in claim 12 wherein said second coefficient is not higher than said first coefficient.

14. A process for polishing a workpiece wherein said workpiece comprises a first material having a first coefficient of friction arranged over a second material having a second coefficient of friction wherein said first coefficient is higher than said second coefficient, comprising,
    holding said workpiece in contact with a polishing pad disposed on a polishing wheel;
    providing a slurry on said polishing pad;
    rotating said workpiece by a first motor;
    rotating said polishing wheel by a second motor wherein rotational speed of said workpiece is above rotational speed of said polishing wheel;
    monitoring current in said first motor;
    detecting an endpoint in said polishing after current in said first motor is reduced.

* * * * *